US012793774B2

(12) United States Patent
Lee et al.

(10) Patent No.: US 12,793,774 B2
(45) Date of Patent: Nov. 10, 2026

(54) MEMORY DEVICE AND OPERATING METHOD OF THE SAME

(71) Applicant: TAIWAN SEMICONDUCTOR MANUFACTURING COMPANY, LTD., Hsinchu (TW)

(72) Inventors: Chun-Ying Lee, Hsinchu (TW); Chieh Lee, Hsinchu (TW); Chia-En Huang, Hsinchu County (TW); Chi Lo, Hsinchu City (TW); Yi-Ching Liu, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 424 days.

(21) Appl. No.: 17/889,707

(22) Filed: Aug. 17, 2022

(65) Prior Publication Data

US 2024/0062818 A1 Feb. 22, 2024

(51) Int. Cl.

| | |
|---|---|
| ***G11C 16/04*** | (2006.01) |
| ***G11C 16/08*** | (2006.01) |
| ***G11C 16/30*** | (2006.01) |

(52) U.S. Cl.
CPC .......... *G11C 16/0433* (2013.01); *G11C 16/08* (2013.01); *G11C 16/30* (2013.01)

(58) Field of Classification Search
CPC ...... G11C 16/08; G11C 16/30; G11C 16/0433
USPC .................................................... 365/185.18
See application file for complete search history.

(56) References Cited

U.S. PATENT DOCUMENTS 5,761,135 A * 6/1998 Lee .......................... G11C 8/08 365/189.11
2004/0190360 A1* 9/2004 Scheuerlein ........... H10B 69/00 257/E27.103
2012/0113740 A1* 5/2012 Lee .......................... G11C 8/08 365/230.06
2023/0178142 A1* 6/2023 Kawamura .............. G11C 8/14 365/230.06

* cited by examiner

*Primary Examiner* — Amir Zarabian
(74) *Attorney, Agent, or Firm* — Birch, Stewart, Kolasch & Birch, LLP

(57) ABSTRACT

A memory device is provided, including a first word line driver configured to activate a first word line. The first word line driver includes a first transistor configured to operate in response to a first control signal having a first voltage level to transmit a first word line voltage to a first word line and a second transistor coupled between the first word line and a supply voltage terminal and configured to be turned off in response to a second control signal having a second voltage level different from the first voltage level.

20 Claims, 14 Drawing Sheets

MEMORY DEVICE AND OPERATING METHOD OF THE SAME

BACKGROUND

The semiconductor integrated circuit (IC) industry has experienced rapid growth. In some approaches of memory devices, for the purposes of optimizing the 3-dimensional (3D) memory area efficiency, peripheral circuits are placed in the limited space under the memory arrays along the vertical direction. Conventional designs for word line driver circuits under the 3D memory device face the challenges caused by the layout area penalty and complexity of decoder routing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
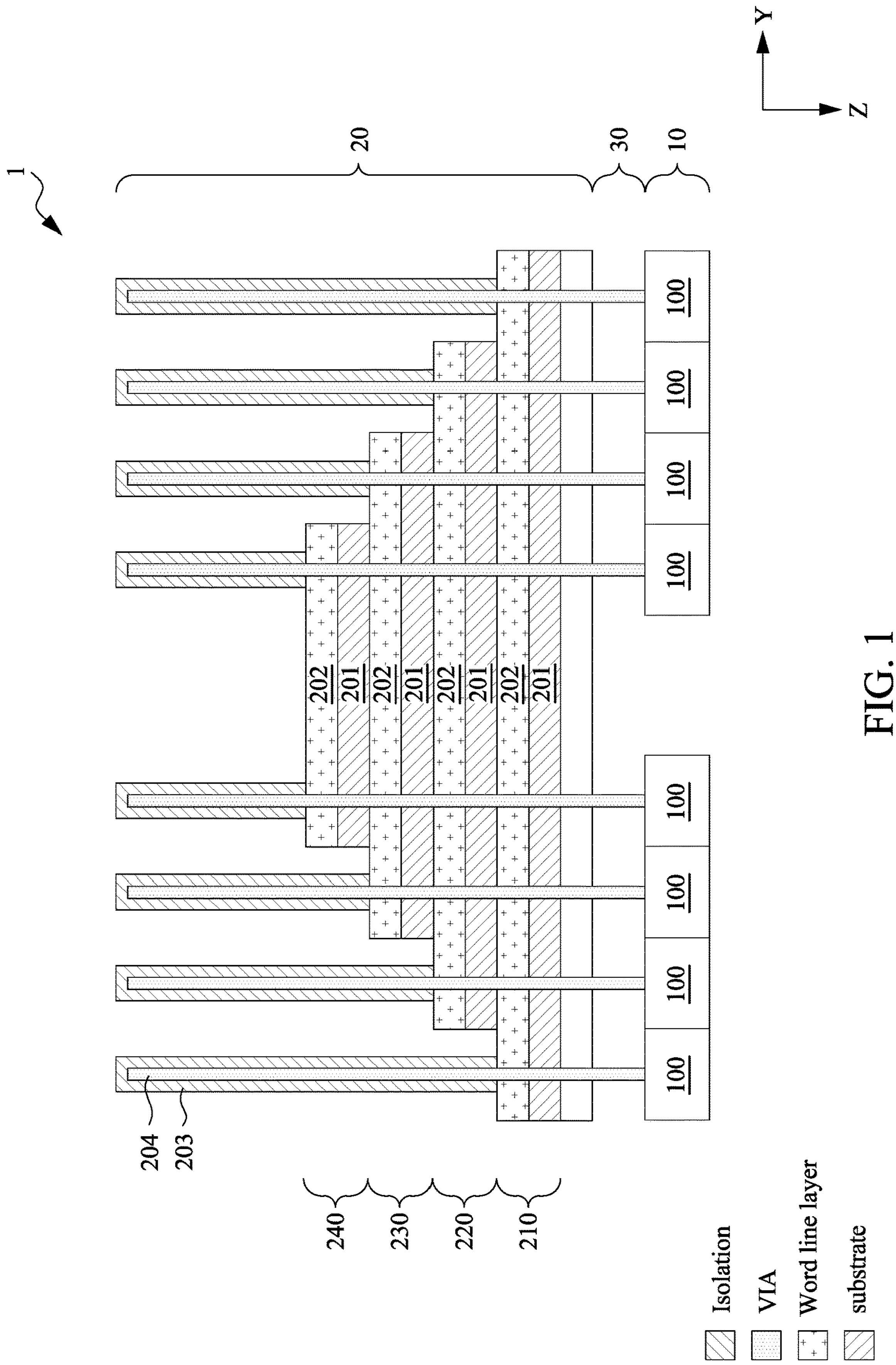
FIG. 1 is a schematic diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

Reference is now made to FIG. 1. FIG. 1 is a schematic diagram of a memory device 1, in accordance with some embodiments. For illustration, in a cross-sectional view, the memory device 1 includes word line drivers 100 in a control circuit layer 10 and memory arrays 210-240 in memory layers 20. In some embodiments, each of the memory arrays 210-240 is disposed in one of the memory layers 20 and above the control circuit layer 10. In some embodiments, the memory device 1 further includes a connection layer 30 including metal routing, for example, connection lines and vias, for transmitting signals between the elements in the control circuit layer 10 and the memory layers 20.

As illustratively shown in FIG. 1, each of the memory arrays 210-240 includes at least a substrate 201 and a word line 202 coupled to a via 203 passing from the control circuit layer 10 to the memory layers 20. A portion of the via 203 above the word line 202 is encompassed with an isolation layer 204 to isolate the via 203 from other signals. In some embodiments, the word line driver 100 is configured to transmit a word line voltage to corresponding word line 202 through the via 203 for accessing a memory cell (not shown) in a corresponding memory array.

The configurations of FIG. 1 are given for illustrative purposes. Various implements are within the contemplated scope of the present disclosure. For example, in some embodiments, the memory device 1 further includes sense amplifiers, control circuits, latches, input/output circuit, decoders, bit line drivers, etc., for operating the memory device 1. In various embodiments, each of the memory arrays 210-240 includes memory cells and multiple word lines, bit lines, etc., for storing and fetching data in the memory cells.

Figure 2:
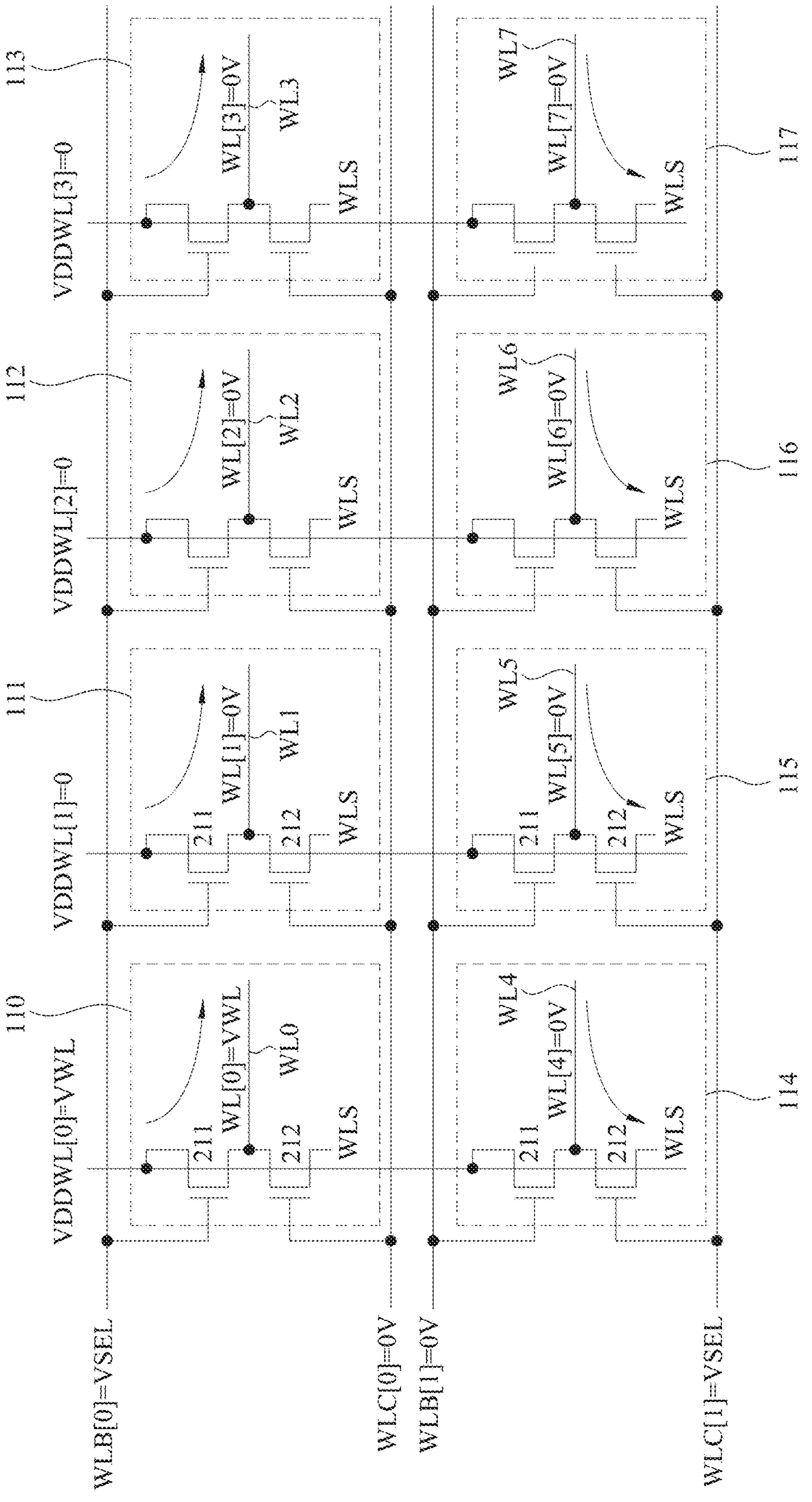
FIG. 2 is a schematic diagram of part of a memory device corresponding to FIG. 1, in accordance with some embodiments.

Reference is now made to FIG. 2. FIG. 2 is a schematic diagram of part of a memory device 1 corresponding to FIG. 1, in accordance with some embodiments. For illustration, the memory device 1 includes multiple word line drivers 110-117. Each of the word line drivers 110-117 has transistors 211-212. In some embodiments, the transistors 211-212 are of the same conductivity type and coupled in series. In the embodiments of FIG. 2, both the transistors 211-212 are N-type Metal-Oxide-Semiconductor Field-Effect Transistor (MOSFET) transistors. Gate terminals of the transistors 211 in the word line drivers 110-113 are configured to receive a control signal WLB[0]. Gate terminals of the transistors 212 in the word line drivers 110-113 are configured to receive a control signal WLC[0]. Gate terminals of the transistors 211 in the word line drivers 114-117 are configured to receive a control signal WLB[1]. Gate terminals of the transistors 212 in the word line drivers 114-117 are configured to receive a control signal WLC[1].

More specifically, taking the word line drivers 110-111 and 114-115 for example, one terminal of the transistor 211 and one terminal of the transistor 212 in a certain word line driver (e.g., the word line driver 110) are coupled together to a corresponding word line (e.g., WL0). The other terminals of the transistors 211 in the word line drivers 110 and 114 are configured to receive the word line voltage signal VDDWL[0], and the other terminals of the transistors 211 in the word line drivers 111 and 115 are configured to receive the word line voltage signal VDDWL[1]. Each of the transistors 212 in the word line drivers 110-111 and 114-115 is coupled between the corresponding word line and a supply voltage terminal WLS. In some embodiments, the supply voltage terminal WLS is configured to provide a ground voltage (e.g., a ground potential, about 0 Volt). The configurations of the word line drivers 112-113 and 116-117 are similar to that of the word line drivers 110-111 and 114-115. Hence, the repetitious descriptions are omitted here.

In some embodiments, the word line drivers 110-113 are configured to generate word line signals WL[0]-WL[3] to word lines WL0-WL3 in response to control signals WLB[0], WLC[0] and word line voltage signals VDDWL[0]-VDDWL[3], in which the control signals WLB[0] and WLC[0] have different logic states during operations. Similarly, in another group of the word line drivers 114-117, the word line drivers 114-117 are configured to generate word line signals WL[4]-WL[7] to word lines WL4-WL7 in response to control signals WLB[1], WLC[1] and the word line voltage signals VDDWL[0]-VDDWL[3], in which the control signals WLB[1] and WLC[1] have different logic states during operations.

In some embodiments, the control signals WLB[0]-WLB[1], WLC[0]-WLC[1], and the word line voltage signals VDDWL[0]-VDDWL[1] are generated by a control circuit (not shown) according to a word line address that indicates a specific memory cell in the memory arrays to be accessed for reading out or writing in data. Accordingly, by decoding the word line address to determine the memory being accessed, a corresponding one (referred to as a selected word line driver) of the word line drivers is configured to generate a word line signal to a selected word line coupled to the memory cell, in which the word line signal has a word line voltage (for example, a word line voltage VWL) sufficient to turn on a gate transistor in the memory cell. For example, with reference to FIG. 2, as the word line WL0 is selected according to the word line address, the word line driver 110 is configured to activate the word line WL0 by transmitting the word line signal WL[0] having the word line voltage VWL, while other word lines WL1-WL7 have about 0 Volt. Thus, the memory cell coupled to the word line WL0 is accessed.

For example, according to some embodiments of the word line driver 110 being selected and the word line drivers 111 and 114-115 being un-selected, shown in FIG. 2, Table I below indicates four cases of voltage levels of the control signals WLB[0]-WLB[1], WLC[0]-WLC[1] and the word line voltage signals VDDWL[0]-VDDWL[1] during operation when certain word line is selected.

TABLE I

| | voltage levels of signals | | | | | |
|---|---|---|---|---|---|---|
| | VDDWL[0] | VDDWL[1] | WLB[0] | WLB[1] | WLC[0] | WLC[1] |
| mode A (Selected) | VWL | | VSEL | | 0 Volt | |
| mode B (un-selected) Type 1 | VWL | | | 0 Volt | | VSEL |
| mode C (un-selected) Type 2 | | 0 Volt | VSEL | | 0 Volt | |
| mode D (un-selected) Type 3 | | 0 Volt | | 0 Volt | | VSEL |

With reference to table I, for illustration, the word line driver 110, referred to as the selected word line driver, is configured to operate in the mode A to generate the word line signal WL[0] having the word line voltage VWL to the selected word line WL0 in an array (e.g., the memory array 210) of the memory arrays 210-240 in response to the control signal WLB[0] having the voltage VSEL (referred to as the high logic state "1") and the control signal WLC[0] having the voltage level of 0 Volt (referred to as the low logic state "0"). Accordingly, the transistor 211 in the word line driver 110 receives the control signal WLB[0] and is turned on in response to the voltage VSEL to transmit the word line voltage VWL, provided by the word line voltage signal VDDWL[0], to the word line WL0.

In some embodiments of utilizing all N-type transistors in the word line drivers, the voltage VSEL equals to a sum of the word line voltage VWL and a threshold voltage of the transistor 211, which is sufficient to fully turn on the transistor 211 to pass the word line voltage VWL to the word line. Alternatively stated, the voltage VSEL is greater than the word line voltage VWL. In various embodiments, gate oxide layers in the transistors 211-212 in one word line driver can be different for high voltage reliability.

With continued reference to table I and FIG. 2, the word line driver 114, referred to as the un-selected word line driver, is configured to operate in the mode B to generate the word line signal WL[4] having the voltage level of 0 Volt to the un-selected word line WL4 in the memory array 210 in response to the control signal WLB[1] having the voltage level of 0 Volt and the control signal WLC[1] having the voltage VSEL. Accordingly, the transistor 211 in the word line driver 114 receives the control signal WLB[1] and is turned off in response to the ground voltage. The transistor 212 receives the control signal WLC[1] and is turned on in response to the voltage VSEL to transmit the word line voltage equal to 0 Volt to the word line WL4. Alternatively stated, the voltage level of the word line WL4 is pulled down by the supply voltage terminal WLS to the ground voltage.

The word line driver 111, referred to as the un-selected word line driver, is configured to operate in the mode C to generate the word line signal WL[1] having the voltage level of 0 Volt to the un-selected word line WL1 in the memory array 210 in response to the control signal WLB[0] having the voltage VSEL and the control signal WLC[0] having the voltage level of 0 Volt. Furthermore, the word line voltage signal VDDWL[1] received by the word line driver 111 provides the word line voltage equal to 0 Volt. Accordingly, the transistor 211 in the word line driver 111 receives the control signal WLB[0] and is turned on in response to the voltage VSEL to transmit 0 Volt, provided by the word line voltage signal VDDWL[1], to the word line WL1.

The word line driver 115, referred to as the un-selected word line driver, is configured to operate in the mode D to generate the word line signal WL[5] having the voltage level of 0 Volt to the un-selected word line WL5 in the memory array 210 in response to the control signal WLB[1] having the voltage level of 0 Volt and the control signal WLC[1] having the voltage VSEL. Accordingly, the transistor 211 in the word line driver 115 receives the control signal WLB[1] and is turned off in response to the ground voltage. The transistor 212 receives the control signal WLC[1] and is turned on in response to the voltage VSEL to transmit the word line voltage equal to 0 Volt to the word line WL5. Alternatively stated, the voltage level of the word line WL5 is pulled down by the supply voltage terminal WLS to the ground voltage.

The configurations of the word line drivers 112-113 are similar to that of the word line driver 111 and the configurations of the word line drivers 116-117 are similar to that of the word line driver 115. Hence, the repetitious descriptions are omitted here, and accordingly signals for the selected and un-selected word line drivers can be summarized in table II below:

TABLE II

| | voltage levels of signals | | | |
|---|---|---|---|---|
| | VDDWL | WLB | WLC | WL |
| mode A (Selected) | VWL | VSEL | 0 Volt | VWL |
| mode B (un-selected Type 1 | VWL | 0 Volt | VSEL | 0 Volt |
| mode C (un-selected) Type 2 | 0 Volt | VSEL | 0 Volt | 0 Volt |
| mode D (un-selected) Type 3 | 0 Volt | 0 Volt | VSEL | 0 Volt |

A word line voltage signal VDDWL, configured with respect to, for example, the word line voltage signals VDDWL[0]-VDDWL[1], corresponds to the signal transmitted to one terminal of the transistor 211 in the word line driver. A control signal WLB, configured with respect to, for example, the control signals WLB[0]-WLB[1], corresponds to the signal transmitted to gate terminal of the transistor 211 in the word line driver. A control signal WLC, configured with respect to, for example, the control signals WLC[0]-WLC[1], corresponds to the signal transmitted to gate terminal of the transistor 212 in the word line driver. A word line signal WL, configured with respect to, for example, the word line signals WL[0]-WL[7], corresponds to the signal outputted by the word line driver at coupled terminals of the transistors 211-212.

The configurations of FIG. 2 are given for illustrative purposes. Various implements are within the contemplated scope of the present disclosure. For example, in some embodiments, the memory device 1 includes more than 8 word line drivers shown in FIG. 2. In various embodiments, the word line driver 110 provides the word line voltage VWL to the word lines WL0 in different memory arrays 210-240 and column decoders (not shown) are configured to couple one of the memory cells that are coupled to the word lines WL0 to an input/output circuit (not shown) for fetching data.

Figure 3A:
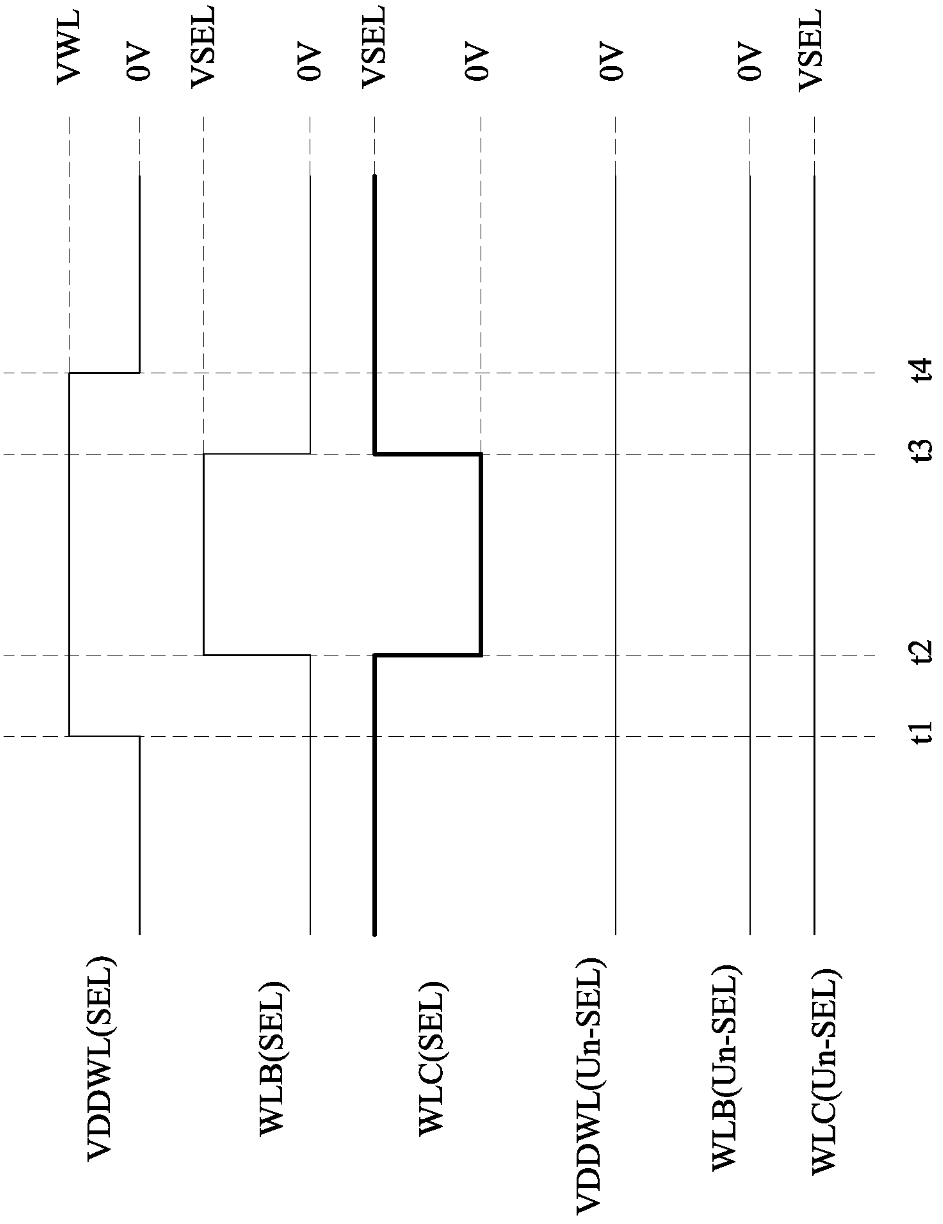
FIG. 3A illustrates schematic waveforms of signals in the memory device of FIG. 1, in accordance with some embodiments.
Figure 3B:
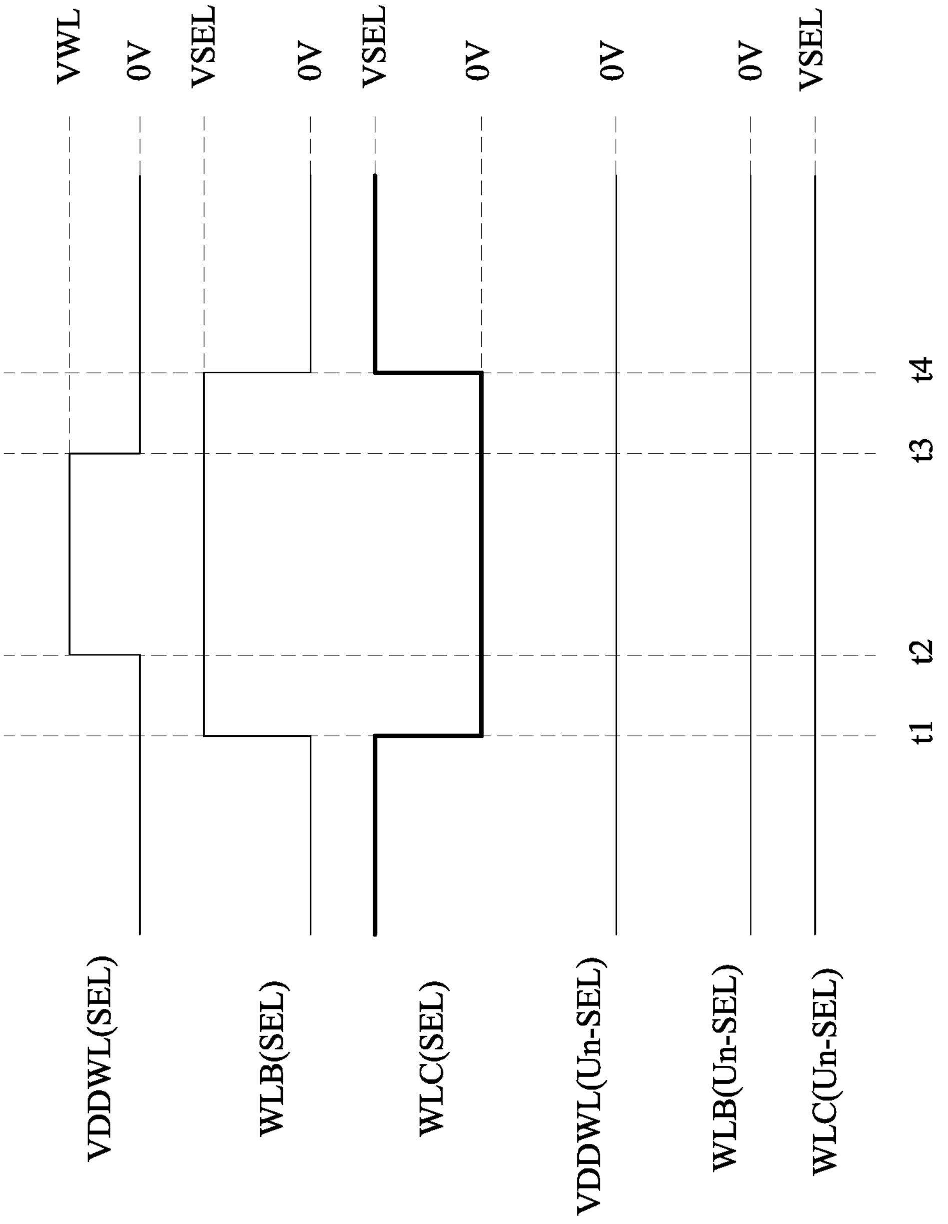
FIG. 3B illustrates schematic waveforms of signals in the memory device of FIG. 1, in accordance with some embodiments.
Figure 3C:
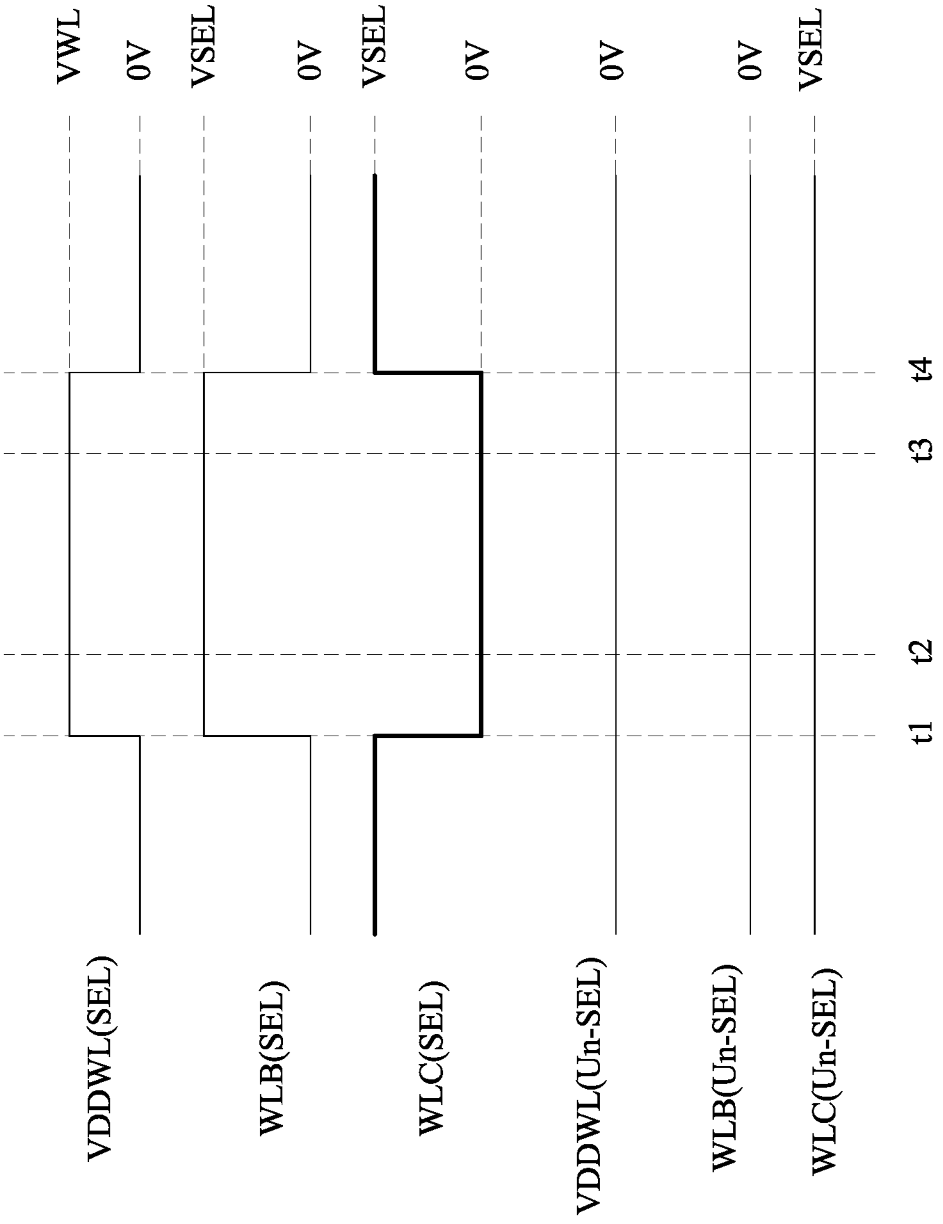
FIG. 3C illustrates schematic waveforms of signals in the memory device of FIG. 1, in accordance with some embodiments.

In some embodiments, the voltage VWL is transmitted to the word line driver before, after, or at the same time the transistors 211-212 are switched. Reference is now made to FIGS. 3A-3C. FIGS. 3A-3C illustrate schematic waveforms of signals in the memory device 1 of FIG. 1, in accordance with some embodiments.

As shown in FIG. 3A, for a selected word line driver (e.g., the word line driver 110), the word line voltage signal VDDWL rises at time t1 to have the voltage level equal to the voltage VWL. The control signal WLB rises from the ground voltage to the voltage VSEL and the control signal WLC falls from the voltage VSEL to the ground voltage at time t2 after time t1. Alternatively stated, one terminal of the transistor 211 is charged to have the voltage VWL before the transistor 211 is turned on. Furthermore, the word line voltage signal VDDWL falls at time t4 while the control signal WLB falls and the control signal WLC rises at time t3 before time t4. A duration of the terminal of the transistor 211 having the voltage VWL is longer than a duration of the transistor 211 being turned on or/and the transistor 212 being turned off.

In various embodiments, as shown in FIG. 313, for a selected word line driver (e.g., the word line driver 110), the word line voltage signal VDDWL rises at time t2 to have the voltage level equal to the voltage VWL, while the control signal WLB rises from the ground voltage to the voltage VSEL and the control signal WLC falls from the voltage VSEL to the ground voltage at time t1 before time t2. Alternatively stated, one terminal of the transistor 211 is charged to have the voltage VWL after the transistor 211 is turned on. Furthermore, the word line voltage signal VDDWL falls at time t3 while the control signal WLB falls and the control signal WLC rises at time t4 after time t3. A duration of the terminal of the transistor 211 having the voltage VWL is shorter than a duration of the transistor 211 being turned on or/and the transistor 212 being turned off.

In various embodiments, as shown in FIG. 3C, for a selected word line driver (e.g., the word line driver 110), the word line voltage signal VDDWL and the control signal rise and the control signal WLC falls at time t1 simultaneously. Furthermore, the signals VDDWL, WLB, WLC switch at time t4 simultaneously. Alternatively stated, a duration of the terminal of the transistor 211 having the voltage VWL and a duration of the transistor 211 being turned on or/and the transistor 212 being turned off are the same.

The configurations of FIGS. 3A-3C are given for illustrative purposes. Various implements are within the contemplated scope of the present disclosure. For example, in some embodiments, the word line voltage signal VDDWL and the control signal WLB rise at the same time and the word line voltage signal VDDWL falls earlier than the control signal WLB.

Figure 4:
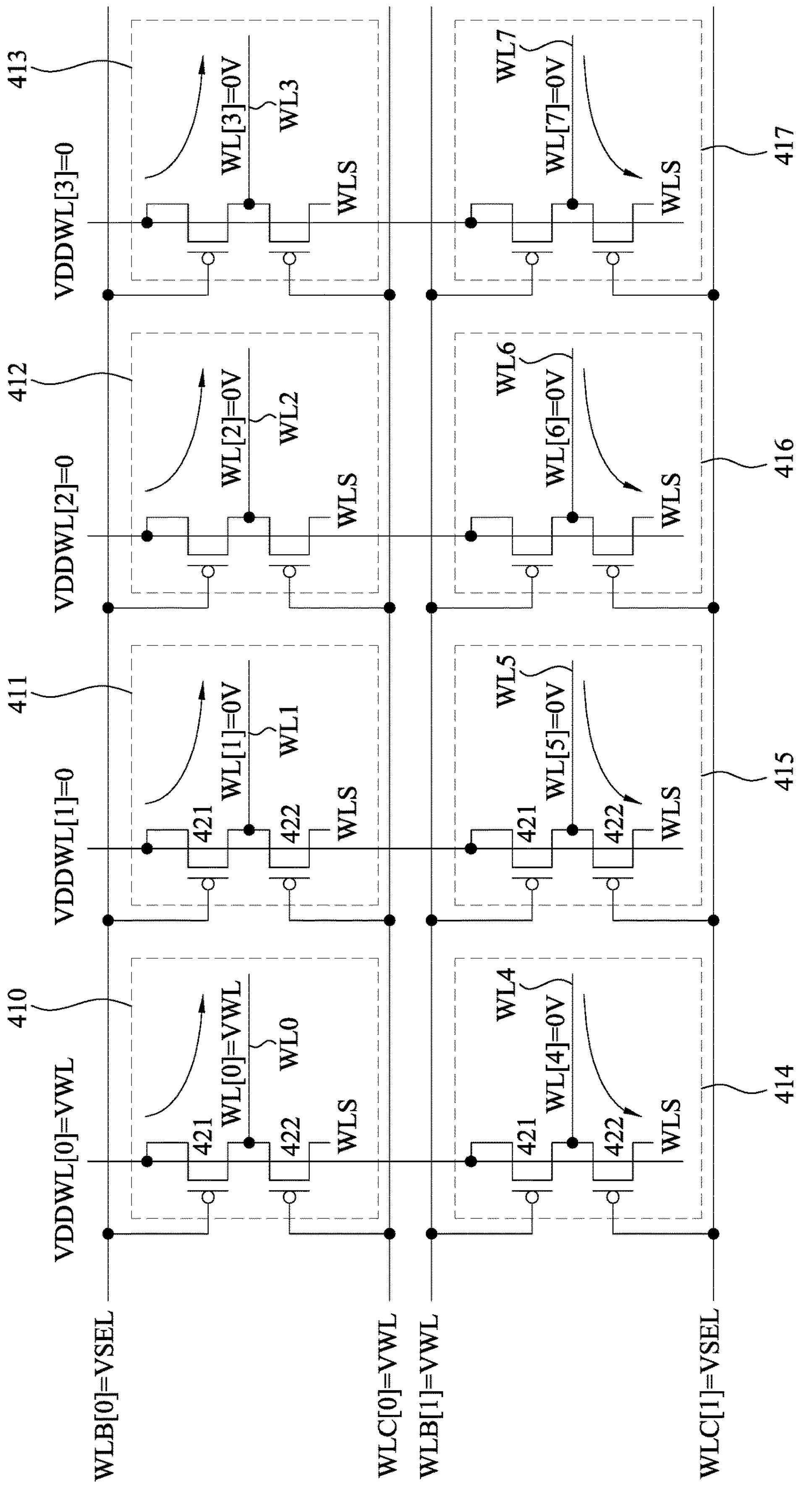
FIG. 4 is a schematic diagram of part of a memory device corresponding to FIG. 1, in accordance with some embodiments.

Reference is now made to FIG. 4. FIG. 4 is a schematic diagram of part of the memory device 1 corresponding to FIG. 1, in accordance with some embodiments. With respect to the embodiments of FIGS. 1-3C, like elements in FIG. 4 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4.

Compared with the embodiments of FIG. 2, instead of having the word line drivers 110-117 having N-type transistors 211-212 to transmit the word line voltages VWL and 0 Volt, the memory device 1 of FIG. 4 includes word line drivers 410-417 each having P-type transistors 421-422. In some embodiments, the word line drivers 410-417 are configured with respect to, for example, the word line drivers 110-117. The transistors 421-422 are configured with respect to, for example, the transistors 211-212. Furthermore, instead of the voltage VSEL being greater than the word line voltage VWL, the voltage VSEL of FIG. 4 is smaller than 0 Volt. In various embodiments, the voltage VSEL is smaller than a difference between the word line voltage VWL (larger than 0 Volt) and a threshold voltage of the transistor 421.

According to some embodiments of the word line driver 410 being selected and the word line drivers 411 and 414-415 being un-selected, shown in FIG. 4, Table III below indicates four cases of voltage levels of the control signals WLB[0]-WLB[1], WLC[0]-WLC[1] and the word line voltage signals VDDWL[0]-VDDWL[1] during operation when certain word line is selected.

TABLE III

| | voltage levels of signals | | | | | |
|---|---|---|---|---|---|---|
| | VDDWL[0] | VDDWL[1] | WLB[0] | WLB[1] | WLC[0] | WLC[1] |
| mode E (Selected) | VWL | | VSEL | | VWL | |
| mode F (un-selected) Type 1 | VWL | | | VWL | | VSEL |
| mode G (un-selected) Type 2 | | 0 Volt | VSEL | | VWL | |
| mode H (un-selected) Type 3 | | 0 Volt | | VWL | | VSEL |

With reference to Table III, for illustration, the word line driver 410, referred to as the selected word line driver, is configured to operate in the mode E to generate the word line signal WL[0] having the word line voltage VWL to the selected word line WL0 in an array (e.g., the memory array 210) of the memory arrays 210-240 in response to the control signal WLB[0] having the voltage VSEL (referred to as the low logic state "0") and the control signal WLC[0] having the voltage VWL (referred to as the high logic state "1"). Accordingly, the transistor 421 in the word line driver 410 receives the control signal WLB[0] and is turned on in response to the voltage VSEL to transmit the word line voltage VWL, provided by the word line voltage signal VDDWL[0], to the word line WL0.

With continued reference to Table III and FIG. 4, the word line driver 414, referred to as the un-selected word line driver, is configured to operate in the mode F to generate the word line signal WL[4] having the voltage level of 0 Volt to the un-selected word line WL4 in the memory array 210 in response to the control signal WLB[1] having the voltage VWL and the control signal WLC[1] having the voltage VSEL. Accordingly, the transistor 421 in the word line driver 414 receives the control signal WLB[1] and is turned off in response to the voltage VWL. The transistor 422 receives the control signal WLC[1] and is turned on in response to the voltage VSEL to transmit the word line voltage equal to 0 Volt to the word line WL4. Alternatively stated, the voltage level of the word line WL4 is pulled down by the supply voltage terminal WLS to the ground voltage.

The word line driver 411, referred to as the un-selected word line driver, is configured to operate in the mode G to generate the word line signal WL[1] having the voltage level of 0 Volt to the un-selected word line WL1 in the memory array 210 in response to the control signal WLB[0] having the voltage VSEL and the control signal WLC[0] having the voltage VWL. Furthermore, the word line voltage signal VDDWL[1] received by the word line driver 411 provides the word line voltage equal to 0 Volt. Accordingly, the transistor 421 in the word line driver 411 receives the control signal WLB[0] and is turned on in response to the voltage VSEL to transmit 0 Volt, provided by the word line voltage signal VDDWL[1], to the word line WL1.

The word line driver 415, referred to as the un-selected word line driver, is configured to operate in the mode H to generate the word line signal WL[5] having the voltage level of 0 Volt to the un-selected word line WL5 in the memory array 210 in response to the control signal WLB[1] having the voltage VWL and the control signal WLC[1] having the voltage VSEL. Accordingly, the transistor 421 in the word line driver 415 receives the control signal WLB[1] and is turned off in response to the voltage VWL. The transistor 422 receives the control signal WLC[1] and is turned on in response to the voltage VSEL to transmit the word line voltage equal to 0 Volt to the word line WL5. Alternatively stated, the voltage level of the word line WL5 is pulled down by the supply voltage terminal WLS to the ground voltage.

The configurations of the word line drivers 412-413 are similar to that of the word line driver 411 and the configurations of the word line drivers 416-417 are similar to that of the word line driver 415. Hence, the repetitious descriptions are omitted here, and accordingly signals for the selected and un-selected word line drivers can be summarized in Table IV below:

TABLE IV

| | voltage levels of signals | | | |
|---|---|---|---|---|
| | VDDWL | WLB | WLC | WL |
| mode E (Selected) | VWL | VSEL | VWL | VWL |
| mode F (un-selected) Type 1 | VWL | VWL | VSEL | 0 Volt |
| mode G (un-selected) Type 2 | 0 Volt | VSEL | VWL | 0 Volt |
| mode H (un-selected) Type 3 | 0 Volt | VWL | VSEL | 0 Volt |

Figure 5:
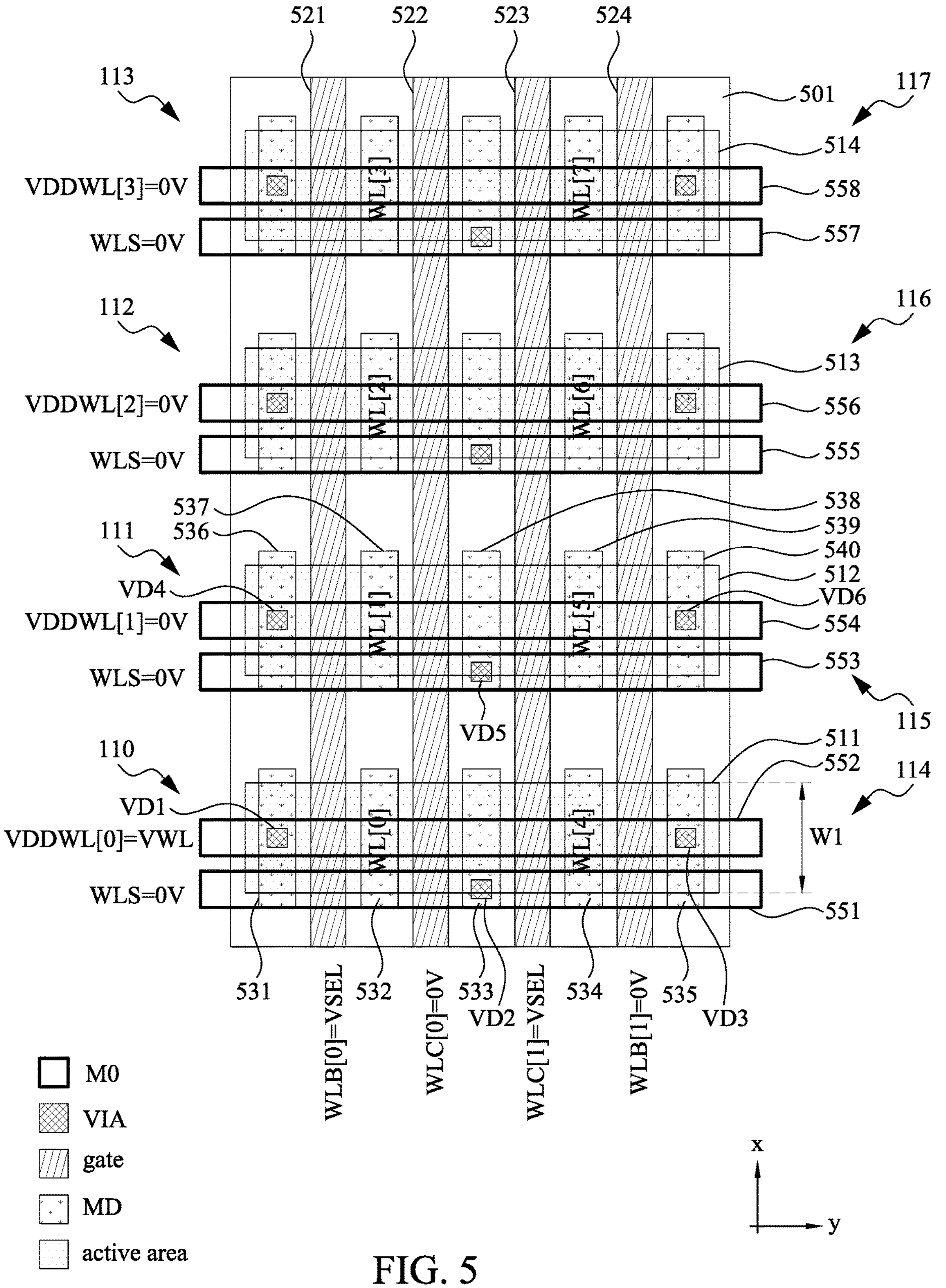
FIG. 5 is layout diagram in a plan view of a section of the memory device corresponding to FIG. 1, in accordance with some embodiments.

Reference is now made to FIG. 5. FIG. 5 is layout diagram in a plan view of a section of the memory device 1 corresponding to FIG. 1, in accordance with some embodiments. For illustration, the memory device 1 includes active areas 511-514 on a substrate 501, gate structures 521-524, conductive segments (e.g., metal-on-device, MD) 531-540, conductive lines (e.g., metal-zero layer, MO) 551-558, and vias VD1-VD6. In some embodiments, the active areas 511-514 are disposed in a first layer of the control circuit layer 10 in FIG. 1. The gate structures 521-524 and the conductive segments 531-540 are disposed in a second layer of the control circuit layer 10 in FIG. 1 above the first layer. The conductive lines 551-558 are disposed in a third layer of the control circuit layer 10 in FIG. 1 above the first and second layers. The vias VD1-VD5 are arranged between the second and third layers.

In some embodiments, with reference to FIGS. 2 and 5, the gate structure 521 corresponds to the transistors 211 in the word line drivers 110-113. The gate structure 522 corresponds to the transistors 212 in the word line drivers 110-113. The gate structure 523 corresponds to the transistors 212 in the word line drivers 114-117. The gate structure 524 corresponds to the transistors 211 in the word line drivers 114-117. The conductive segments 531 and 535 correspond to the terminals, receiving the word line voltage signal VDDWL[0], of the transistors 211 in the word line drivers 110 and 114 respectively. The conductive segments 536 and 540 correspond to the terminals, receiving the word line voltage signal VDDWL[1], of the transistors 211 in the word line drivers 111 and 115 respectively. The conductive segment 533 correspond to the terminals, coupled to the supply voltage terminal WLS, the transistors 212 in the word line drivers 110 and 114. The conductive segment 538 correspond to the terminals, coupled to the supply voltage terminal WLS, the transistors 212 in the word line drivers 111 and 115. The conductive segment 532 corresponds to the terminals, generating the word line signal WL[0] and coupled to the word line WL0, of the transistors 211-212 in the word line driver 110. The conductive segment 534 corresponds to the terminals, generating the word line signal WL[4] and coupled to the word line WL4, of the transistors 211-212 in the word line driver 114. The conductive segment 537 corresponds to the terminals, generating the word line signal WL[1] and coupled to the word line WL1, of the transistors 211-212 in the word line driver 111. The conductive segment 539 corresponds to the terminals, generating the word line signal WL[5] and coupled to the word line WL5, of the transistors 211-212 in the word line driver 115. The configurations of the word line drivers 112-113 and 116-117 are similar to that of the word line drivers 110-111 and 114-115. Hence, the repetitious descriptions are omitted here.

The active areas 511-514 extend in y direction and are separated from each other in x direction. In some embodiments, the active areas 511-514 are of the same conductivity type, for example, N-type. In some embodiments, the active areas 511-514 have a width W1 along x direction.

The gate structures 521-524 extend in x direction and cross the active areas 511-514. In some embodiments, the gate structure 521 is configured to receive the control signal WLB[0] having the voltage VSEL, the gate structure 522 is configured to receive the control signal WLC[0] having 0 Volt, the gate structure 523 is configured to receive the control signal WLC[1] having the voltage VSEL, and the gate structure 524 is configured to receive the control signal WLB[1] having 0 Volt.

The conductive segments 531-535 are disposed on the active area 511. The conductive segment 531 is coupled with the conductive segment 535 through the conductive line 552 and the vias VD1 and VD3 to receive the word line voltage signal VDDWL[0] having the word line voltage VWL. The conductive segment 533 is coupled the conductive line 551 through the via VD2 to receive the word line voltage equal to 0 volt from the supply voltage terminal WLS. Similarly, the conductive segments 536-540 are disposed on the active area 512. The conductive segment 536 is coupled with the conductive segment 540 through the conductive line 554 and the vias VD4 and VD6 to receive the word line voltage signal VDDWL[1] having 0 Volt. The conductive segment 538 is coupled the conductive line 553 through the via VD5 to receive the word line voltage equal to 0 volt from the supply voltage terminal WLS.

With reference to FIGS. 1, 2, and 5, for example, the conductive segment 532 is further configured to transmit the word line signal WL[0] to the memory arrays 210-240 through the vias 203 and metal routing in the connection layer 30. In some embodiments, one of the vias 203 is coupled to the conductive segment 532. The configurations of the conductive segments 534, 537, and 539 are similar to the conductive segment 532. Hence, the repetitious descriptions are omitted here.

In some approaches, a word line driver utilizes transistors having different conductivity types, for example, both P and N types, in generating word line voltages to word lines. For example, said word line driver includes one P type transistor and two P type transistors. Accordingly, at least two semiconductor regions having different wells (e.g., N well for P type transistors and P well for N type transistors) and different components result in complexity for signal routing and area overhead. Furthermore, according to some approaches, non-continuous gate structures in N type transistor induce asymmetric layout design, which causes yield loss.

With the configurations of the present application, reduced numbers of transistors, having the same conductivity type, provide word line signals, which significantly improves area efficiency by at least 50% and further simplifies metal routing in design.

The configurations of FIG. 5 are given for illustrative purposes. Various implements are within the contemplated scope of the present disclosure. For example, the embodiments of FIG. 5 also correspond to FIG. 4.

Figure 6B:
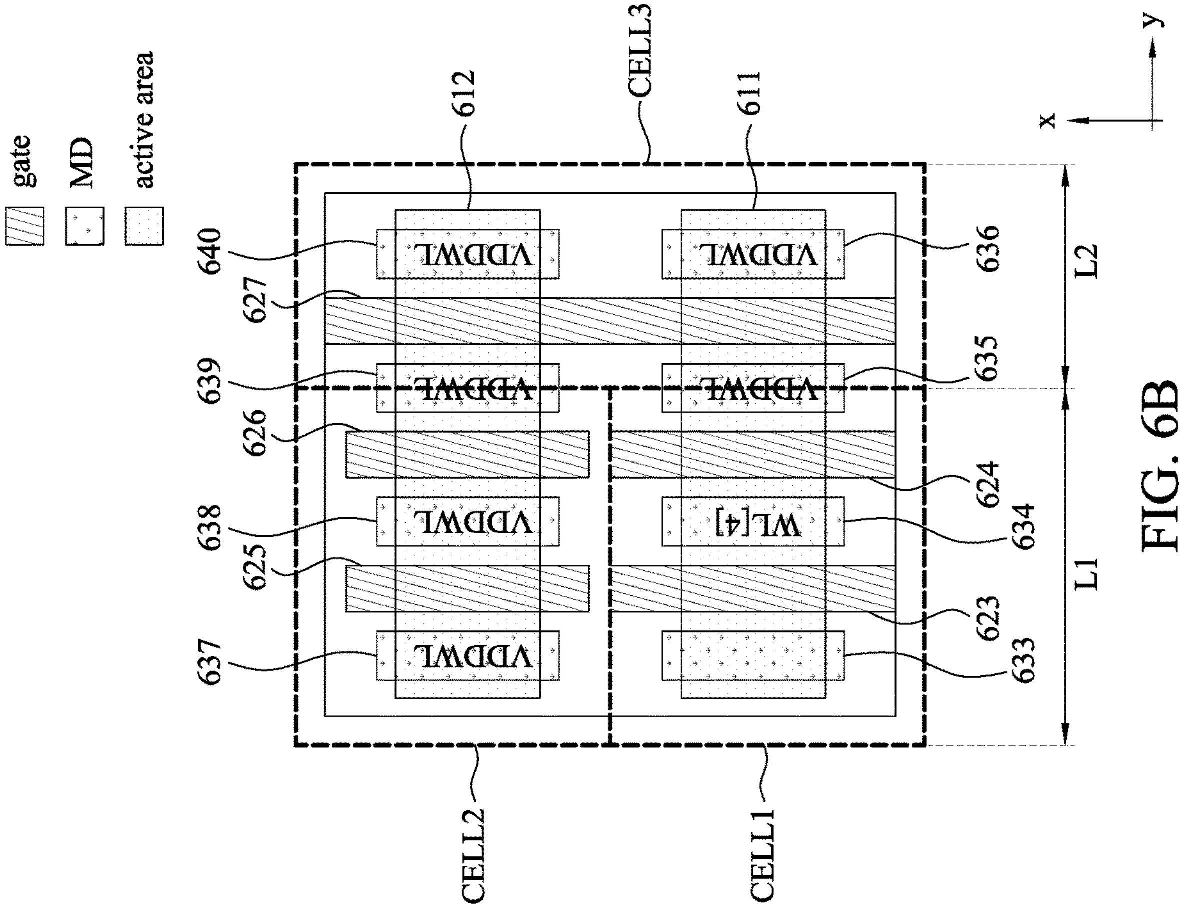
FIG. 6B is layout diagram in a plan view of a section of the memory device corresponding to FIG. 6A, in accordance with some embodiments.
Figure 6A:
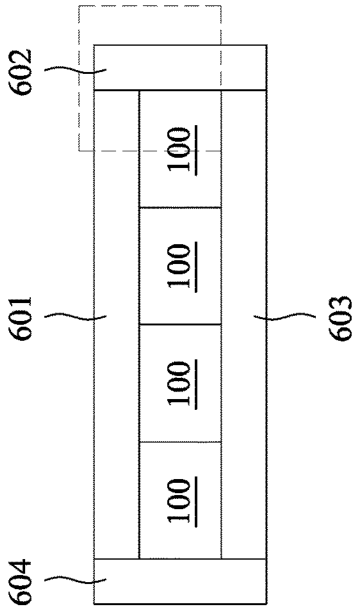
FIG. 6A is layout diagram in a plan view of a section of the memory device corresponding to FIG. 1, in accordance with some embodiments.

Reference is now made to FIGS. 6A-6B. FIGS. 6A-6B are layout diagrams in a plan view of a section of the memory device 1 corresponding to FIG. 1, in accordance with some embodiments. For illustration, in FIG. 6A, the memory device 1 further includes edge cells 601-604 around the word line drivers 100. In some embodiments, the edge cells 601-604 are referred to as dummy cells and do not have function in the memory device 1.

FIG. 6B illustrates a dashed region of FIG. 6A in a detailed way. As illustratively shown in FIG. 6B, a cell CELL1 corresponds to part of the word line driver 100 configured with respect to, for example, the word line driver 114 of FIG. 5. A cell CELL2 corresponds to the edge cell 601 of FIG. 6A, and a cell CELL3 corresponds to the edge cell 602 of FIG. 6A.

The memory device 1 includes active areas 611-612, gate structures 623-627, and conductive segments 633-640. In some embodiments, the active areas 611-612 are configured with respect to, for example, the active area 511 of FIG. 5.

In the cell CELL1, the gate structures 623-624 are configured with respect to, for example, the gate structures 523-524 for transmitting the control signal WLC[1] and WLB[1] respectively. The conductive segments 633 and 634 are configured with respect to, for example, the conductive segments 533 and 534 that coupled to the supply voltage terminal WLS and the word line WL4 respectively.

For illustration, the cell CELL2 abuts the cell CELL1 along x direction and includes the gate structures 625-626 that are coupled to the supply voltage terminal WLS to receive 0 Volt, according to some embodiments. The cell CELL2 further includes the conductive segments 637-638 disposed on the active area 612. In some embodiments, the conductive segments 637-638 are configured to receive one of the word line voltage signals VDDWL[0]-VDDWL[1]. In various embodiments, the conductive segments 637-638 are coupled to the supply voltage terminal WLS.

The cell CELL3 abuts the cells CELL1-CELL2 along y direction and includes the gate structure 627 extending in x direction and passing next to the cells CELL I-CELL2. The cell CELL3 further includes the conductive segments 636 and 640 that are configured with respect to, for example, the conductive segments 637-638 in the cell CELL2. Specifically, the conductive segments 636 and 640 are configured to receive one of the word line voltage signals VDDWL[0]-VDDWL[1]. In some embodiments, the cell CELL3 has a length L2 equal to half of a length L1 of the cell CELL1.

In some embodiments, the gate structures 625-627 are referred to as dummy gates, in which in some embodiments, the "dummy" gate is referred to as being not electrically connected as the gate for MOS devices, having no function in the circuit.

With configurations of dummy edge cells near the word line drivers provided in the present application, the yield increases in manufacturing processes.

Figure 6C:
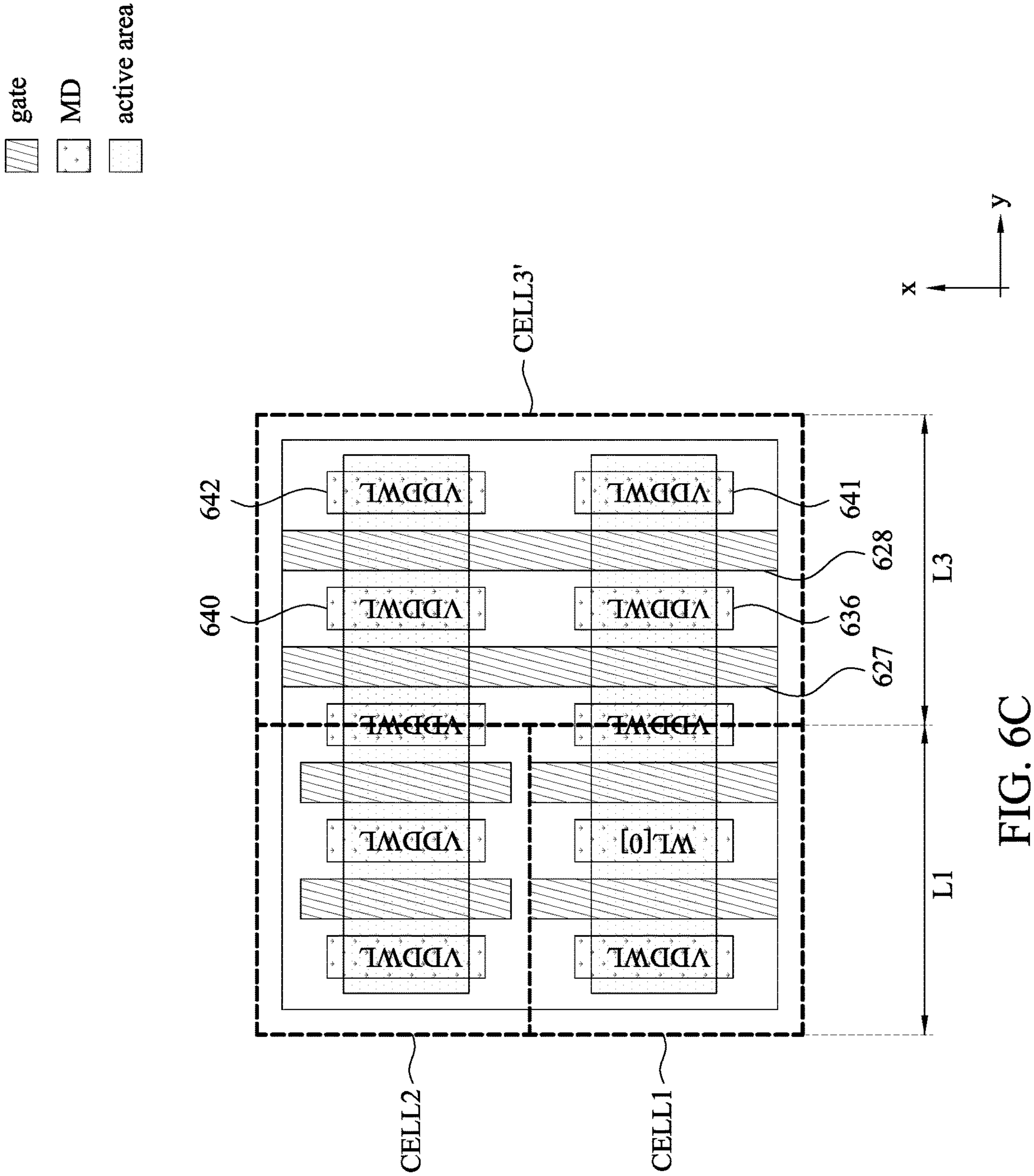
FIG. 6C is layout diagram in a plan view of a section of the memory device corresponding to FIG. 6A, in accordance with some embodiments.

Reference is now made to FIG. 6C. FIG. 6C is layout diagram in a plan view of a section of the memory device 1 corresponding to FIG. 6A, in accordance with some embodiments.

Compared with FIG. 6B, instead of having the cell CELL3, the embodiments in FIG. 6C is a cell CELL3' having a length L3 equal to the length L1 of the cell CELL1. In some embodiments, the cell CELL3 is configured with respect to, for example, the cell CELL3. Specifically, the cell CELL3' further includes a gate structure 628, extending parallel to the gate structure 627, and conductive segments 641-642. In some embodiments, the conductive segments 641-642 are configured with respect to, for example, the conductive segments 636 and 640.

The configurations of FIGS. 6A-6C are given for illustrative purposes. Various implements are within the contemplated scope of the present disclosure. For example, in some embodiments, the memory device 1 has an edge cell that abuts the cell CELL1 and has a length larger than the length L1.

Figure 7:
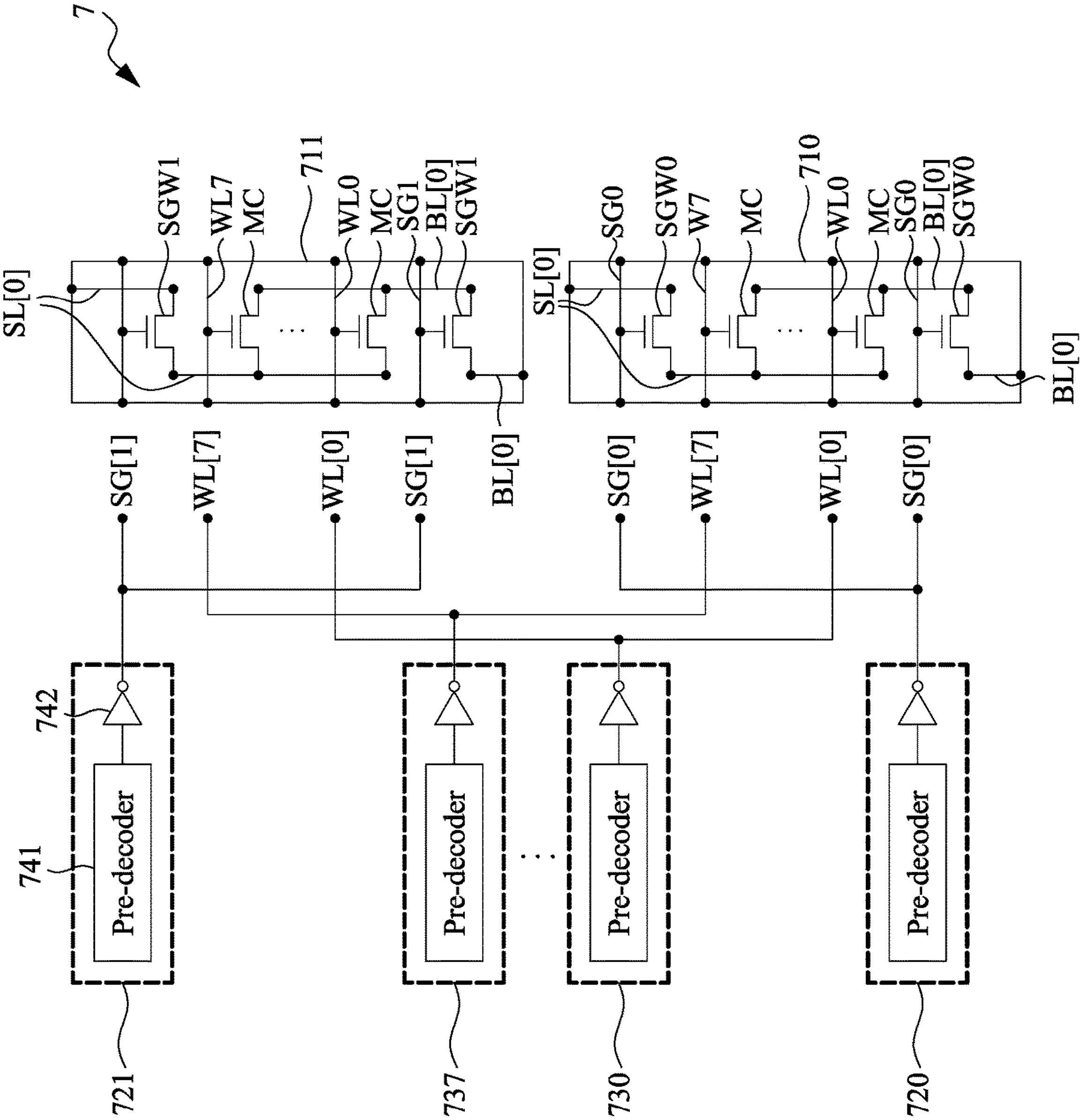
FIG. 7 is a schematic diagram of a memory device, in accordance with some embodiments.

Reference is now made to FIG. 7. FIG. 7 is a schematic diagram of a memory device 7, in accordance with some embodiments. For illustration, the memory device 7 includes memory arrays 710-711, word line drivers 720-721 and 730-737. In some embodiments, each of the memory arrays 710-711 includes memory cells MC coupled in parallel between data lines SL[0] and BL[0] and selection gate switches SGW0, SGW1. As illustratively shown in FIG. 7, for example, one of the selection gate switches SGW0 in the memory array 710 is coupled between two portions of the data line SL[0], and the other is coupled between two portions of the data line BL[0]. Gate terminals of the selection gate switches SGW0 are coupled to word lines SG0 to receive the selection signal SG[0]. In some embodiments, the selection gate switches SGW0 is configured to be turned on in response to the selection signal SG[0] in read or write operation performed to one of the memory cells MC in the memory array 710. Each of the memory cells MC is configured to be accessed in response to a corresponding one of word line signals WL[0]-WL[7] transmitted through a corresponding one of word line WL0-WL7. The configurations of the memory array 711 are similar to the memory array 710. Hence, the repetitious descriptions are omitted here. In some embodiments, each of the word line drivers 720-721 and 730-737 has a pre-decoder 741 and an inverter 742 for generating word line signals.

In some embodiments, the memory cells MC includes dynamic random access memory (DRAM), ferroelectric RAM (FeRAM), or any other suitable 3D memory designs.

In some embodiments, the word line driver 720 is configured to generate the selection signal SG[0] in response to a word line address indicating one of the memory cells MC in the memory array 710 being selected and accessed. Each of the word line drivers 730-737 is coupled to corresponding two word lines, for example, WL0 in the memory arrays 710-711 and is configured to transmit the word line voltage VWL to the corresponding word lines for turning on the memory cell MC. Alternatively stated, each of the word line drivers 730-737 transmits the word line voltage VWL to at least two word lines in at least two separated memory arrays.

For example, when the word line address indicates that the memory cell MC coupled to the word line WL0 in the memory array 710 is selected to be accessed, the selection gate switches SGW0 are turned on and the selection gate switches SGW1 are turned off. The word lines WL0 has the word line voltage VWL and the word lines WL1-WL7 in the memory arrays 710-711 has the ground voltage. Accordingly, the corresponding memory cell MC is accessed.

Figure 8:
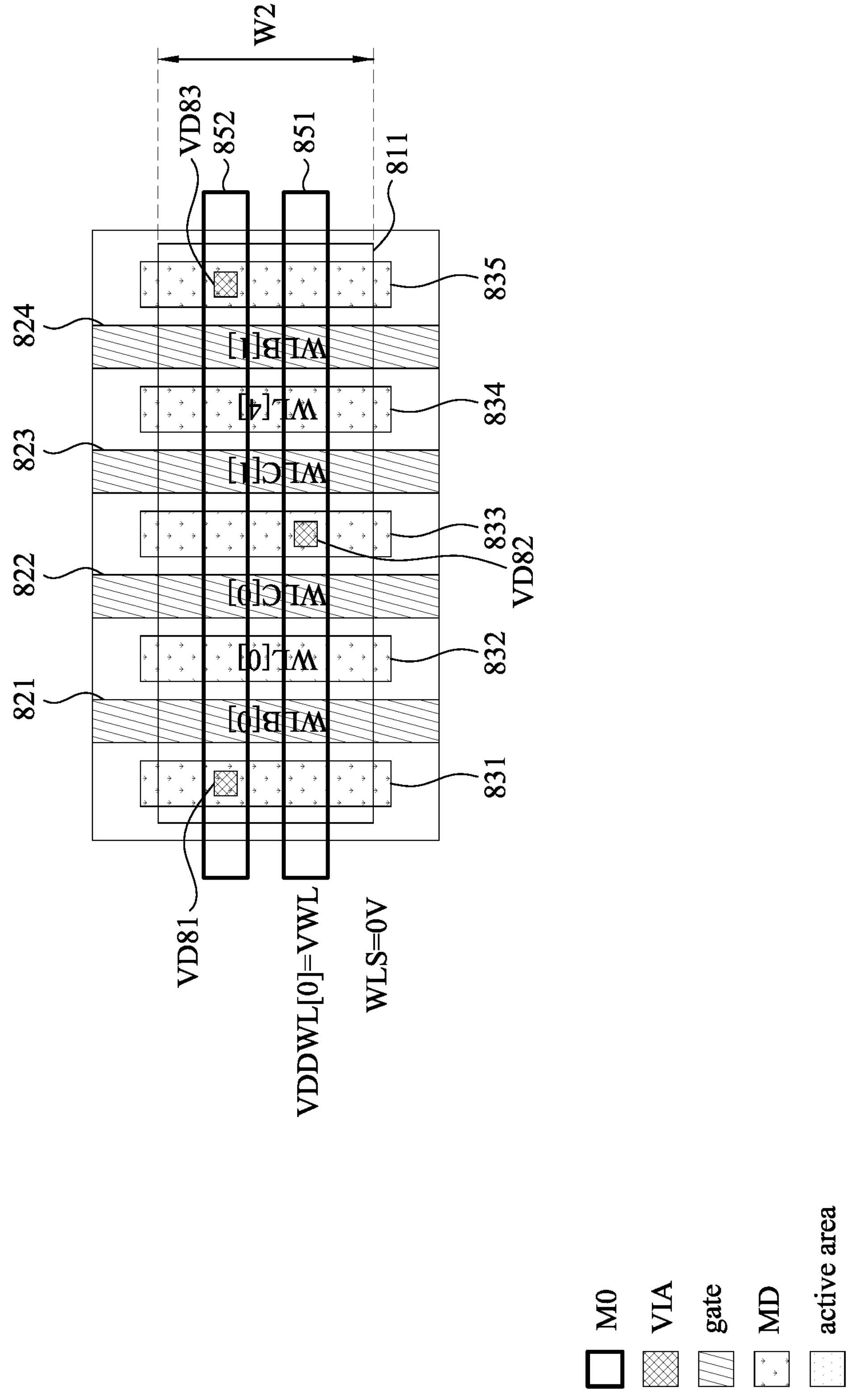
FIG. 8 is layout diagram in a plan view of a section of the memory device corresponding to FIG. 7, in accordance with some embodiments.

In various embodiments, the word line drivers 730-737 are configured with respect to, for example, the word line driver 110 of FIG. 2 of the word line driver 410 of FIG. 4. Reference is now made to FIG. 8. FIG. 8 is layout diagram in a plan view of a section of the memory device 7 corresponding to FIG. 7, in accordance with some embodiments. With respect to the embodiments of FIGS. 1-7, like elements in FIG. 8 are designated with the same reference numbers for ease of understanding.

The memory device 7 includes an active area 811, gate structures 821-824, conductive segments 831-835, conductive lines 851-852, and vias VD81-VD83. In some embodiments, the active area 811 is configured with respect to, for example, the active area 511 of FIG. 5. The gate structures 821-824 are configured with respect to, for example, the gate structures 521-524 of FIG. 5. The conductive segments 831-835 are configured with respect to, for example, the conductive segments 531-535 of FIG. 5. The conductive lines 851-852 are configured with respect to, for example, the conductive lines 551-552. The vias VD81-VD83 are configured with respect to, for example, the vias VD1-VD3 of FIG. 5.

In some embodiments, the word line driver 730 includes the transistors 211-212 corresponding to that in the word line driver 110 of FIG. 2, and the word line driver 734 includes the transistors 211-212 corresponding to that in the word line driver 114. The gate structure 821 corresponds to the gate terminal of the transistor 211 in the word line driver 730, and the gate structure 822 corresponds to the gate terminal of the transistor 212 in the word line driver 730. The gate structure 823 corresponds to the gate terminal of the transistor 212 in the word line driver 734, and the gate structure 824 corresponds to the gate terminal of the transistor 211 in the word line driver 734. The conductive segment 832 corresponds to the terminals generating the word line signal WL[0]. The conductive segment 834 corresponds to the terminals generating the word line signal WL[4].

Compared with the embodiments of FIG. 5, the active area 811 has a width W2 greater than the width W1 while the word line drivers 730 and 734 provide word line signals to both the memory arrays 710-711.

With the configurations of the present application, by memory arrays sharing word line drivers, an amount of necessary word line drivers reduces and therefore, area efficiency of the memory device increases. For example, at least 16 word line drivers are used to drive 16 word lines in two memory arrays. In some embodiments of the present application, a total 10 of the word line drives, including 2 for selection gate switches and 8 shared word line drivers for the 16 word lines, are implemented.

The configurations of FIGS. 7-8 are given for illustrative purposes. Various implements are within the contemplated scope of the present disclosure. For example, in some embodiments, the word line drivers 730-737 provide word line signals to more than two memory arrays.

Figure 9:
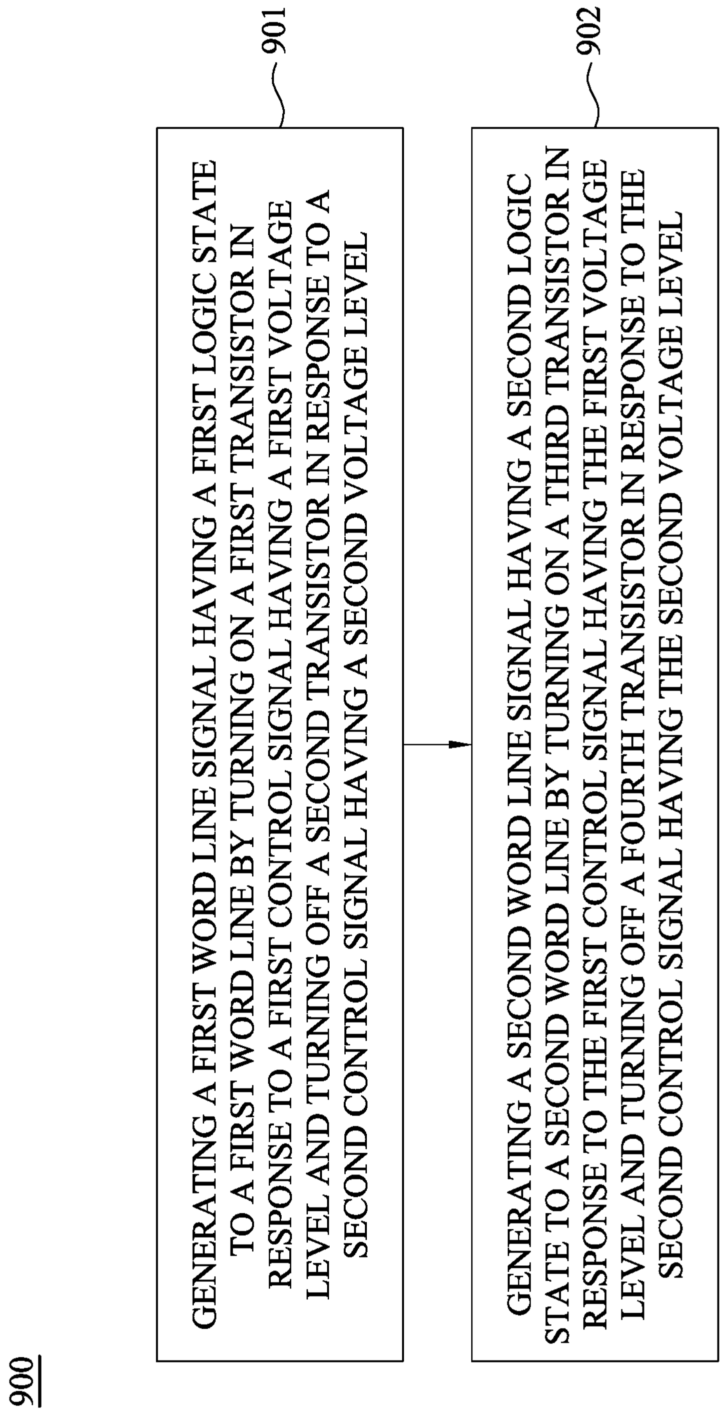
FIG. 9 is a flow chart of an operating method of a memory device, in accordance with some embodiments.

Reference is now made to FIG. 9. FIG. 9 is a flow chart of an operating method 900 of a memory device, in accordance with some embodiments. It is understood that additional operations/stages can be provided before, during, and after the processes shown by FIG. 9, and some of the operations/stages described below can be replaced or eliminated, for additional embodiments of the method 900. The method 900 includes operations 901-902 and will be discussed in the following paragraphs with reference to FIGS. 2-3C.

In operation 901, as shown in FIG. 2, the word line signal WL[0] having high logic state (corresponding to the word line voltage VWL) is generated to the word line WL by turning on the transistor 211 in the word line driver 110 in response to the control signal WLB[0] having the voltage VSEL and turning off the transistor 212 in the word line driver 110 in response to the control signal WLC[0] having 0 Volt.

In operation 902, as shown in FIG. 2, the second word line signal WL[1] having the low second logic state is generated to the word line WL1 by turning on the transistor 211 in the word line driver 111 in response to the control signal WLB[0] having the voltage level VSEL and turning off the transistor 212 in the word line driver 111 in response to the control signal WLC[0] having 0 Volt.

In some embodiments, the method 900 further includes operations of generating the word line signal WL[5] having the low logic state to the word line WL5 by turning off the transistor 211 in the word line driver 115 in response to the control signal WLB[1] having 0 Volt and turning on the transistor 212 in the word line driver 115 in response to the control signal WLC[1] having the voltage VSEL.

With reference to FIGS. 3A-3B, the method 900 further includes operations of (1) before turning on the and transistors 211 in the word line drivers 110 and 111, transmitting the word line voltage VWL to the terminal, receiving the word line voltage signal VDDWL[0], of the transistor 211 in the word line driver 110 and transmitting the word line voltage equal 0 Volt to the terminal, receiving the word line voltage signal VDDWL[0], of the transistor 211 in the word line driver 111, or (2) after turning on the and transistors 211 in the word line drivers 110 and 111, transmitting the word line voltage VWL to the terminal, receiving the word line voltage signal VDDWL[0], of the transistor 211 in the word line driver 110 and transmitting the word line voltage equal 0 Volt to the terminal, receiving the word line voltage signal VDDWL[0], of the transistor 211 in the word line driver 111.

With reference to FIG. 3C, the method 900 further includes operations of rising the control signal, for example; WLB[0] and the word line voltage signal, for example, VDDWL[0] and falling the control signal, for example, WLC[0] at time t1 simultaneously.

Figure 10:
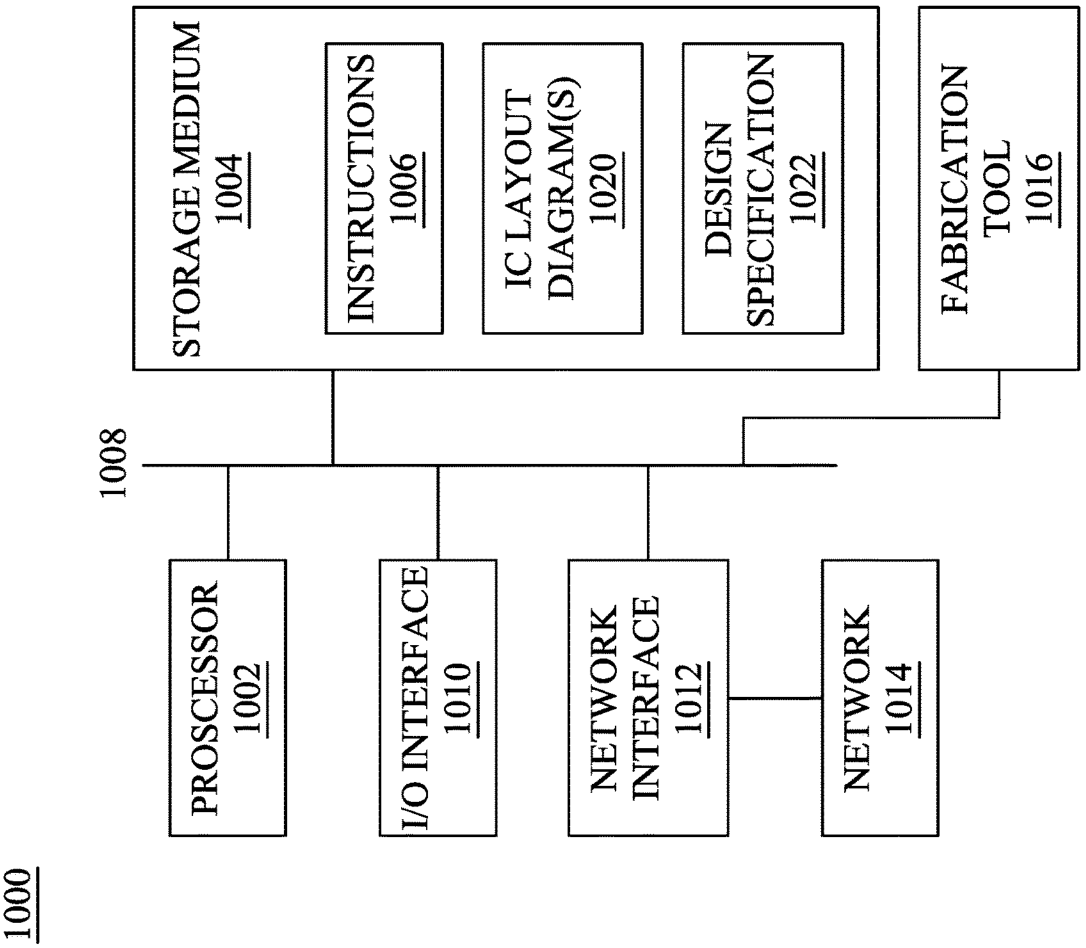
FIG. 10 is a block diagram of a system for designing the integrated circuit layout design, in accordance with some embodiments of the present disclosure.

Reference is now made to FIG. 10. FIG. 10 is a block diagram of an electronic design automation (EDA) system 1000 for designing the integrated circuit layout design, in accordance with some embodiments of the present disclosure. EDA system 1000 is configured to implement one or more operations of the operating method 900 disclosed in FIG. 9, and further explained in conjunction with FIGS. 1-8. In some embodiments, EDA system 1000 includes an APR system.

In some embodiments, EDA system 1000 is a general purpose computing device including a hardware processor 1002 and a non-transitory, computer-readable storage medium 1004. Storage medium 1004, amongst other things, is encoded with, i.e., stores, computer program code (instructions) 1006, i.e., a set of executable instructions. Execution of instructions 1006 by hardware processor 1002 represents (at least in part) an EDA tool which implements a portion or all of, e.g., the operating method 900.

The processor 1002 is electrically coupled to computer-readable storage medium 1004 via a bus 1008. The processor 1002 is also electrically coupled to an I/O interface 1010 and a fabrication tool 1016 by bus 1008. A network interface 1012 is also electrically connected to processor 1002 via bus 1008. Network interface 1012 is connected to a network 1014, so that processor 1002 and computer-readable storage medium 1004 are capable of connecting to external elements via network 1014. The processor 1002 is configured to execute computer program code 1006 encoded in computer-readable storage medium 1004 in order to cause EDA system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause EDA system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 stores IC layout diagram 1020 of standard cells including such standard cells as disclosed herein, for example, a cell including in the memory device discussed above with respect to FIGS. 1-8.

EDA system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

EDA system 1000 also includes network interface 1012 coupled to processor 1002. Network interface 1012 allows EDA system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1064. In one or more embodiments, a portion or all of noted processes and/or methods, is implemented in two or more systems 1000.

EDA system 1000 also includes the fabrication tool 1016 coupled to processor 1002. The fabrication tool 1016 is configured to fabricate integrated circuits, e.g., the memory device in FIGS. 1-8, according to the design files processed by the processor 1002.

EDA system 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. EDA system 1000 is configured to receive information related to a UI through I/O interface 1010. The information is stored in computer-readable medium 1004 as design specification 1022.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 11:
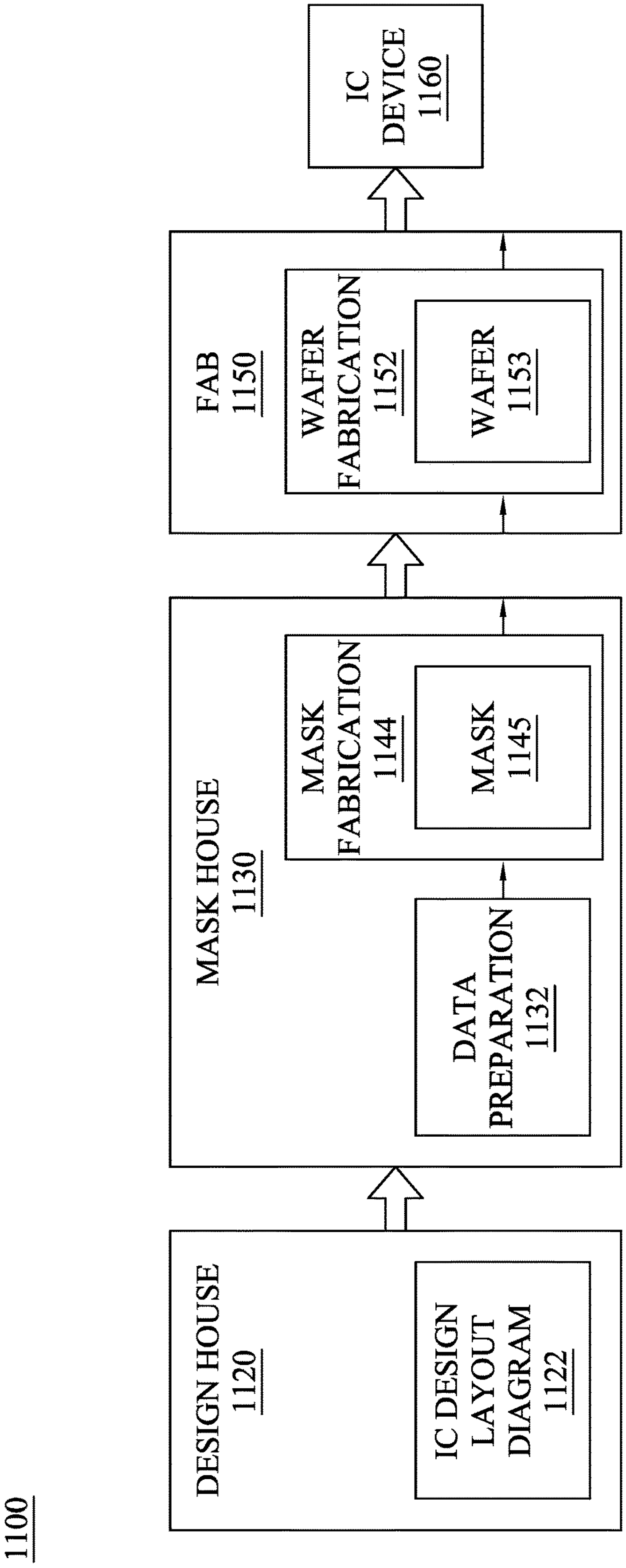
FIG. 11 is a block diagram of an integrated circuit manufacturing system, and an integrated circuit manufacturing flow associated therewith, in accordance with some embodiments.

FIG. 11 is a block diagram of IC manufacturing system 1100, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in IC manufacturing system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns, for example, an IC layout design depicted in FIGS. 5-6C and 8, designed for an IC device 1160, for example, the memory device discussed above with respect to FIGS. 1-8. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file ("RDF"). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The IC design layout diagram 1122 is manipulated by mask data preparation 1132 to comply with particular characteristics of the mask writer and/or requirements of IC fab 1150. In FIG. 11, data preparation 1132 and mask fabrication 1144 are illustrated as separate elements. In some embodiments, data preparation 1132 and mask fabrication 1144 can be collectively referred to as mask data preparation.

In some embodiments, data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

It should be understood that the above description of data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1145 includes a transparent substrate (for example, fused quartz) and an opaque material (for example, chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 includes wafer fabrication 1152. IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multilevel interconnects, and the like (formed at subsequent manufacturing steps).

As described above, a memory device and an operating method thereof are provided in the present application. By utilizing transistors having the same conductivity type in word line drivers, area usage and routing design are significantly improved. Accordingly, the yield of manufacturing processes increases.

In some embodiments, a memory device is provided, including a first word line driver configured to activate a first word line. The first word line driver includes a first transistor configured to operate in response to a first control signal having a first voltage level to transmit a first word line voltage to a first word line and a second transistor coupled between the first word line and a supply voltage terminal and configured to be turned off in response to a second control signal having a second voltage level different from the first voltage level.

In some embodiments, a method is provided, including operations of generating a first word line signal having a first logic state to a first word line by turning on a first transistor in response to a first control signal having a first voltage level and turning off a second transistor in response to a second control signal having a second voltage level, in which the first transistor has a gate terminal receiving the first control signal, a first terminal receiving a first word line voltage, and a second terminal coupled to the first word line and a first terminal of the second transistor and the second transistor has a gate terminal receiving the second control signal and a second terminal coupled to a supply voltage terminal; and generating a second word line signal having a second logic state to a second word line by turning on a third transistor in response to the first control signal having the first voltage level and turning off a fourth transistor in response to the second control signal having the second voltage level, in which the third transistor has a gate terminal receiving the first control signal, a first terminal receiving a second word line voltage different from the first word line voltage, and a second terminal coupled to the second word line and a first terminal of the fourth transistor and the fourth transistor has a gate terminal receiving the second control signal and a second terminal coupled to the supply voltage terminal.

In some embodiments, a memory device is provided and includes multiple memory arrays each disposed in one of multiple memory layers and multiple word line drivers in a control circuit layer below the memory layers. A first driver in the word line drivers is configured to generate a first word line signal having a first word line voltage to a selected word line in an array of the memory arrays in response to a first control signal having a first logic state and a second control signal having a second logic state. A second driver in the word line drivers is configured to generate a second word line signal having a second word line voltage to an unselected word line in the array in response to a third control signal having the second logic state and a fourth control signal having the first logic state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

a plurality of memory arrays; and a plurality of word line drivers coupled to the plurality of memory arrays, wherein a first word line driver in the plurality of word line drivers is configured to activate a first word line and comprises:

a first transistor configured to operate in response to a first control signal having a first voltage level to transmit a first word line voltage to the first word line; and a second transistor coupled between the first word line and a supply voltage terminal and configured to be turned off in response to a second control signal having a second voltage level different from the first voltage level;

wherein a second word line driver in the plurality of word line drivers comprises:

a third transistor that is coupled to a second word line different from the first word line has a gate terminal coupled to a gate terminal of the first transistor; and a fourth transistor that is coupled between the second word line and the supply voltage terminal and has a gate terminal coupled to a gate terminal of the second transistor;

wherein a third word line driver in the plurality of word line drivers is configured to activate a third word line and a fourth word line, and further configured to transmit, in response to a third control signal having the first voltage level, a second word line voltage, to the third word line coupled to a memory cell in a first array of the plurality of memory arrays and to the fourth word line coupled to a memory cell in a second array, separated from the first array, of the plurality of memory arrays;

wherein a fourth word line driver in the plurality of word line drivers is configured to generate a fourth control signal to turn on first and second selection gate switches that are coupled to the memory cell, being accessed, in the first array, wherein the first and second selection gate switches are coupled to first and second terminals of the memory cell in the first array respectively.

2. The memory device of claim 1, wherein the first and second transistors are of the same conductivity type.

3. The memory device of claim 1, wherein the first voltage level is greater than the first word line voltage.

4. The memory device of claim 1, wherein the first and second transistors are of P conductivity type, and the first voltage level is smaller than a difference between the first word line voltage and a threshold voltage of the first transistor.

5. The memory device of claim 1,
wherein the second word line voltage is lower than the first word line voltage.

6. The memory device of claim 5, wherein the first to fourth transistors are of N conductivity type.

7. The memory device of claim 5, wherein the third transistor is configured to be turned on in response to the first control signal having the first voltage level to transmit the second word line voltage to the second word line.

8. The memory device of claim 7, further comprising:
a fifth word line driver comprising:
a fifth transistor coupled to a fifth word line and configured to be turned off in response to a fifth control signal having the second voltage level; and
a sixth transistor coupled between the fifth word line and the supply voltage terminal and configured to transmit, in response to the third control signal having the first voltage level, the second word line voltage to the fifth word line,
wherein first terminals of the third and fifth transistors are configured to receive a sixth control signal providing the second word line voltage,
a second terminal of the third transistor is coupled to the second word line, and
a second terminal of the fifth transistor is coupled to the fifth word line.

9. The memory device of claim 1, further comprising:
first and second active areas that are of the same conductivity type;
a first conductive segment disposed on the first active area and corresponding to a terminal, coupled to the first word line, of the second transistor;
a second conductive segment disposed on the second active area and corresponding to a terminal, coupled to the second word line, of the fourth transistor; and
a first gate structure crossing the first and second active areas and corresponding to the gate terminals, receiving the second control signal, of the second and fourth transistors.

10. The memory device of claim 9, further comprising:
a second gate structure crossing the first and second active areas and corresponding to the gate terminals, receiving the first control signal, of the first transistor and the third transistor;
a third conductive segment disposed on the first active area and corresponding to a terminal, configured to transmit the first word line voltage, of the first transistor; and
a fourth conductive segment disposed on the second active area and corresponding to a terminal, configured to transmit the second word line voltage, lower than the first word line voltage, of the third transistor,
wherein the third and fourth transistors are coupled in series.

11. A method, comprising:
generating a first word line signal having a first logic state to a first word line by turning on a first transistor in response to a first control signal having a first voltage level and turning off a second transistor in response to a second control signal having a second voltage level,
wherein the first transistor has a gate terminal receiving the first control signal, a first terminal receiving a first word line voltage, and a second terminal coupled to the first word line and a first terminal of the second transistor,
wherein the second transistor has a gate terminal receiving the second control signal and a second terminal coupled to a supply voltage terminal; and
generating a second word line signal having a second logic state to a second word line by turning on a third transistor in response to the first control signal having the first voltage level and turning off a fourth transistor in response to the second control signal having the second voltage level,
wherein the third transistor has a gate terminal receiving the first control signal, a first terminal receiving a second word line voltage different from the first word line voltage, and a second terminal coupled to the second word line and a first terminal of the fourth transistor,
wherein the fourth transistor has a gate terminal receiving the second control signal and a second terminal coupled to the supply voltage terminal.

12. The method of claim 11, wherein the second word line voltage is smaller than the first word line voltage when the first word line is selected.

13. The method of claim 11, further comprising:
generating a third word line signal having the second logic state to a third word line by turning off a fifth transistor in response to a third control signal having the second voltage level and turning on a sixth transistor in response to a fourth control signal having the first voltage level,
wherein the fifth transistor has a gate terminal receiving the third control signal, a first terminal coupled to the first terminal of the third transistor, and a second terminal coupled to the third word line and a first terminal of the sixth transistor,
wherein the sixth transistor has a gate terminal receiving the fourth control signal and a second terminal coupled to the supply voltage terminal.

14. The method of claim 11, further comprising:
before turning on the first and third transistors, transmitting the first word line voltage to the first terminal of the first transistor and transmitting the second word line voltage to the first terminal of the third transistor, or
after turning on the first and third transistors, transmitting the first word line voltage to the first terminal of the first transistor and transmitting the second word line voltage to the first terminal of the third transistor.

15. The method of claim 11, wherein the first and third transistors are of N conductivity type, and
the first word line voltage is smaller than the first voltage level.

16. The method of claim 15, further comprising:
rising the first control signal and a word line voltage signal and falling the second control signal simultaneously.

17. A memory device, comprising:
a plurality of memory arrays each disposed in one of a plurality of memory layers; and
a plurality of word line drivers in a control circuit layer below the plurality of memory layers in a cross-sectional view, wherein a first driver in the plurality of word line drivers is configured to generate a first word line signal having a first word line voltage to a selected word line in an array of the plurality of memory arrays in response to a first control signal having a first logic state and a second control signal having a second logic state different from the first logic state,
wherein a second driver in the plurality of word line drivers is configured to generate a second word line signal having a second word line voltage to an unselected word line in the array in response to a third control signal having the second logic state and a fourth control signal having the first logic state;

wherein the first driver comprises a first transistor that has a gate terminal receiving the second control signal, a first source/drain terminal coupled to the selected word line, and a second source/drain terminal coupled to a supply voltage terminal, wherein the second driver comprises a second transistor that has a gate terminal receiving the fourth control signal, a first source/drain terminal coupled to the unselected word line, and a second source/drain terminal coupled to the supply voltage terminal, wherein a third driver in the plurality of word line drivers is configured to transmit the first word line voltage to a third word line coupled to a memory cell in a first array of the plurality of memory arrays and a fourth word line coupled to a memory cell in a second array, separated from the first array, of the plurality of memory arrays, wherein a fourth driver in the plurality of word line drivers is configured to generate a fifth control signal to turn on first and second selection gate switches that are coupled to the memory cell, being accessed, in the first array, wherein the first and second selection gate switches are coupled to first and second terminals of the memory cell in the first array respectively.

18. The memory device of claim 17, wherein the first driver in the plurality of word line drivers further comprises:

a third transistor having a gate terminal configured to receive the second control signal, and configured to be turned off, in response to the second control signal.

19. The memory device of claim 17, wherein the second word line voltage is lower than the first word line voltage.

20. The memory device of claim 1, wherein each of the plurality of memory arrays is disposed in one of a plurality of memory layers, and the plurality of word line drivers are disposed in a control circuit layer below the plurality of memory layers in a cross-sectional view.

* * * * *